(12) United States Patent
Detofsky et al.

(10) Patent No.: US 8,710,858 B2
(45) Date of Patent: Apr. 29, 2014

(54) MICRO POSITIONING TEST SOCKET AND METHODS FOR ACTIVE PRECISION ALIGNMENT AND CO-PLANARITY FEEDBACK

(75) Inventors: Abram M Detofsky, Tigard, OR (US); Todd P Albertson, Warren, OR (US); David Shia, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 690 days.

(21) Appl. No.: 12/888,579

(22) Filed: Sep. 23, 2010

(65) Prior Publication Data

US 2012/0074975 A1   Mar. 29, 2012

(51) Int. Cl.
*G01R 31/00* (2006.01)
(52) U.S. Cl.
USPC ............ 324/756.01; 324/756.02; 324/750.17; 439/374; 439/331; 439/70; 439/71; 439/219; 356/614; 361/727
(58) Field of Classification Search
USPC .......... 324/750.17, 756.01–756.02; 361/727; 439/331, 70–71, 219, 374; 356/614
See application file for complete search history.

(56) References Cited

U.S. PATENT DOCUMENTS

| | | | | |
|---|---|---|---|---|
| 6,118,292 | A * | 9/2000 | Antonello et al. | 324/750.25 |
| 6,292,003 | B1 * | 9/2001 | Fredrickson et al. | 324/750.25 |
| 7,101,209 | B2 * | 9/2006 | Yates et al. | 439/331 |
| 7,132,824 | B2 * | 11/2006 | Masuda et al. | 324/207.12 |
| 7,189,092 | B2 * | 3/2007 | Piatti | 439/330 |
| 7,458,820 | B2 * | 12/2008 | Ohta | 439/73 |
| 7,605,928 | B2 * | 10/2009 | Rakhovsky | 356/614 |
| 7,637,752 | B2 * | 12/2009 | Hsieh et al. | 439/70 |
| 7,715,931 | B2 * | 5/2010 | Johnson et al. | 700/57 |
| 7,867,005 | B2 * | 1/2011 | Hsiao et al. | 439/331 |
| 7,868,642 | B2 * | 1/2011 | Naito et al. | 324/762.02 |
| 8,149,005 | B2 * | 4/2012 | Matsumoto et al. | 324/750.16 |
| 2008/0238460 | A1 * | 10/2008 | Kress et al. | 324/758 |

\* cited by examiner

*Primary Examiner* — Hezron E Williams
*Assistant Examiner* — Hoang Nguyen
(74) *Attorney, Agent, or Firm* — Winkle, PLLC

(57) ABSTRACT

Methods and structures for testing a microelectronic packaging structure/device are described. Those methods may include placing a device in a floating carrier, wherein the floating carrier is coupled to a socket housing by pin dowels disposed in four corners of the socket housing, and wherein at least two actuating motors are disposed within the socket housing, and micro adjusting the device by utilizing a capacitive coupled or a fiber optic alignment system wherein a maximum measured capacitance or maximum measured intensity between alignment structures disposed in the socket housing and alignment package balls disposed within the device indicate optimal alignment of the device. Methods further include methods for active co-planarity detection through the use of a capacitive-coupled techniques.

14 Claims, 12 Drawing Sheets

MICRO POSITIONING TEST SOCKET AND METHODS FOR ACTIVE PRECISION ALIGNMENT AND CO-PLANARITY FEEDBACK

BACKGROUND OF THE INVENTION

As microelectronic packaging technology advances for higher processor performance, establishing good mechanical contact between a microelectronic package and pins used in fine pitch packages becomes an important consideration. Such fine pitch packages may exhibit poor tolerances, and reliance on purely mechanical alignment techniques may be insufficient, and may result in unacceptably high retest rates for fine-pitch products, for example. Additionally, co-planarity problems which may occur when a package is mis-seated into a test socket, for example, may damage both the package and the socket.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
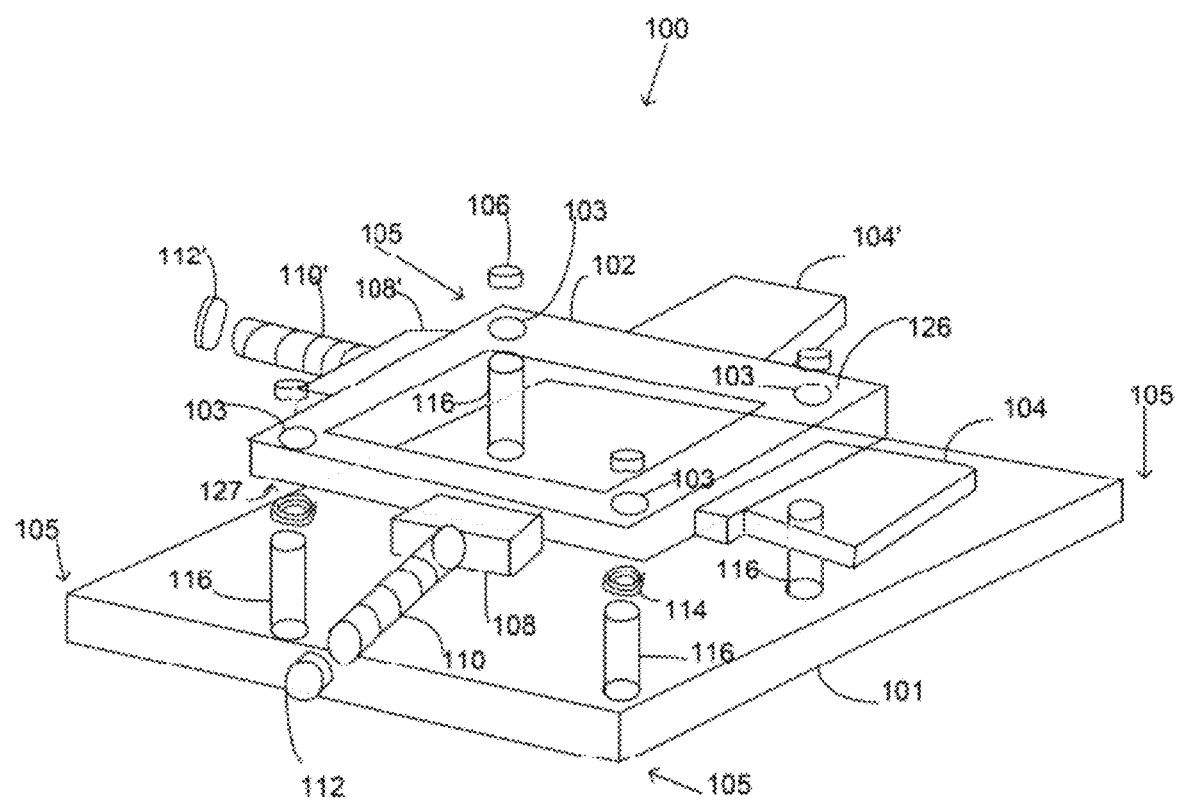
FIGS. 1a-1d represent structures according to embodiments of the present invention.

In the following detailed description, reference is made to the accompanying drawings that show, by way of illustration, specific embodiments in which the methods may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of testing a packaging structure, such as a fine pitch BGA package structure, are described. Those methods may include placing a device in a floating carrier, wherein the floating carrier is coupled to a socket housing by pin dowels disposed in four corners of the socket housing, and wherein at least two actuating motors are disposed within the socket housing, and micro adjusting the device by utilizing a capacitive coupled or a fiber optic alignment system wherein a maximum measured capacitance between alignment structures disposed in the socket housing and alignment package balls disposed within the device indicate optimal alignment of the device. Methods of the embodiments enable the socket to fine tune the X and Y positions of the package/device to achieve better pin to pad alignment.

Figure 1B:
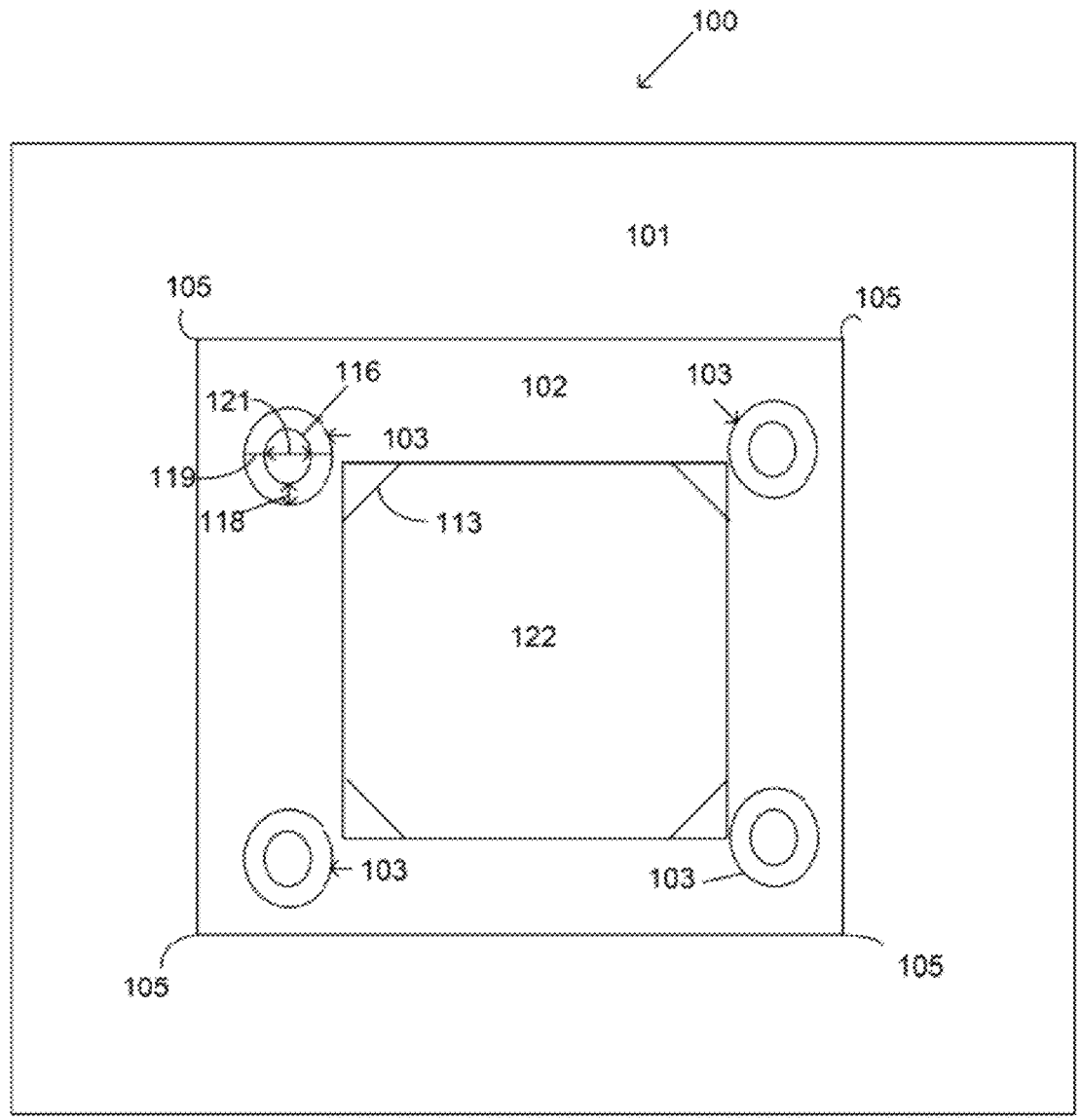

FIGS. 1a-1d illustrate embodiments of a socket structure 100, such as a micro positioning test socket structure/assembly 100, for example. FIG. 1a illustrates an exploded view of such a socket structure 100 embodiment, comprising a floating carrier 102, which does not make full contact with a main test socket housing 101 (i.e. the floating carrier 102 does not compress a device under test (DUT) into the socket), during non-testing conditions. The floating carrier 102 may be coupled with/attached to the socket housing 101 via a dowel pin 116 located at each of four corners 105 of the socket housing 101. The floating carrier 102 of the socket assembly 100 further comprises four holes 103 located in the vicinity of four corners 105 of the floating carrier 102, wherein a diameter 119 of the floating carrier holes 103 is slightly larger than a diameter 121 of the dowel pins 116 (FIG. 1b, top view). In an embodiment, the socket housing 101 comprises one dowel pin 116 disposed through each of the four holes 103 located in the four corners of the floating carrier 102 that couple the socket 101 with the floating carrier 102.

There may be a gap 118 between the dowel pins 116 and the floating carrier holes 103. The oversized floating carrier holes 103 may allow the floating carrier 102 to move freely in both an X and Y direction over the socket housing 101 thus enabling the socket 101 to fine tune the X & Y positions of the package within the carrier to achieve better pin to pad alignment. In prior art alignment schemes, such as in passive alignment systems, once a package is seated inside the socket opening, it's X & Y positions can no longer be adjusted.

Referring back to FIG. 1a, the floating carrier 102 sits on top of/is coupled with four springs 114 which are used to provide restoring force to return the floating carrier 102 to its original vertical position after a socketing process is performed. In an embodiment, the four springs 114 are coupled to/in between the dowel pins 116 and the floating carrier 102 on a second side 127 of the floating carrier 102. Caps 106 disposed above each of the corners 105 of a first side 126 of the floating carrier 102 are coupled with the dowel pins 116, and serve to prevent the floating carrier 102 from separating from the dowel pins 116, in an embodiment. Two preload caps 112, 112' located at the end of two preload springs 110, 110' may serve to fix the springs 114 inside the floating carrier holes 103, and to push against pushers 108, 108' with a pre-determined preload.

Figure 1C:
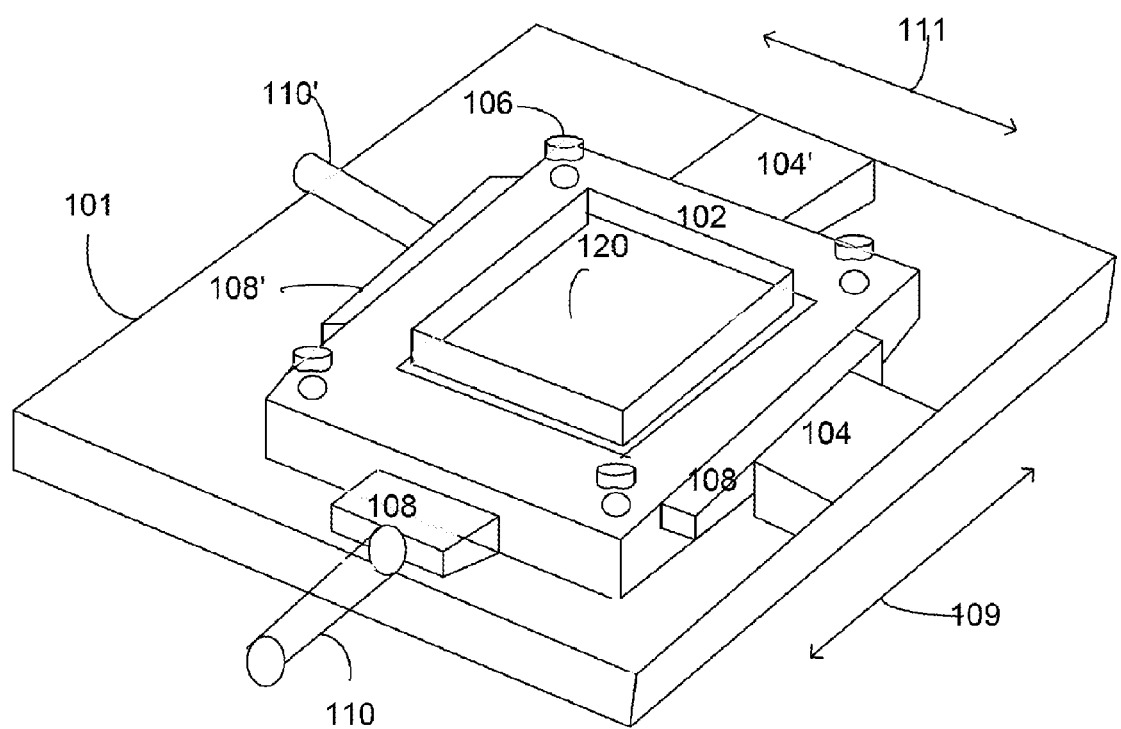

Actuation motors 104, 104' may be disposed within the socket housing 101, and may be coupled with the floating carrier 102 (FIG. 1c, assembled view). In an embodiment, the actuation motors 104, 104' may be located in periphery locations of the socket housing 101, and the actuation motors 104, 104' may be disposed at approximately right angles to each other within the socket housing 101. In an embodiment, the actuation motors 104, 104' may comprise piezoelectric linear motors. In an embodiment, the actuation motors 104, 104' may comprise two penny-sized piezoelectric linear motors to perform x and y positioning of BGA packages/chips that may be subsequently placed within the carrier 102. Actuation motors 104, 104' may operate to move the floating carrier 102 back and forth over the socket housing 101.

In an embodiment, pushers 108, 108' may push the floating carrier 102 in an X 109 and a Y 111 direction, and may serve to position a package/device 120 sitting inside the floating carrier 102. The package/device 120 may be disposed over a socket pin field area 122 of the socket housing 101. The actuation motors 104, 104 may align the package/device 120 disposed within the carrier 102, such as a BGA package/chip, with socket pins 122 disposed within the socket housing 101.

In an embodiment, the package/device 120, such as but not limited to a BGA package, for example, may be placed inside the floating carrier 102, and may be supported within the floating carrier on four shelves 113 located in an interior portion of the four corners 103 of the floating carrier 102 (referring back to (FIG. 1b, top view). Prior to socketing the package/device 120 into the socket housing pin area 122, the floating carrier plate 102 serves to keep the package/device 120 suspended above the socket pin array 122, which may comprise a contactor pogo pin array 122 in some embodiments. By keeping the package/device 120 suspended above the socket housing 101, the floating carrier 102 serves to prevent scraping of package/device 120 pins/interconnect structures, such as BGA interconnect structures, and also prevents bending pins/interconnect structures of the socket housing pin array 122 during positioning of the package/device 120 over the pin field area 122.

In an embodiment, the actuation motors 104, 104' may be removed easily from the socket housing 101. Easily removable actuation motors 104, 104' facilitates re-use, repair, and replacement of the actuation motors 104, 104'. In an embodiment, an active socket housing 101 design comprising two penny-sized piezoelectric linear motors to perform X & Y positioning of BGA packages, for example, is enabled. The active socket housing design of the embodiments allows for alignment of a DUT with socket pins of a test socket, for example. Establishing good mechanical contact between a device, such as a package, and socket pins is a critical concern for finely pitched package structures (e.g, packages comprising a pitch of less than about 0.4 mm).

Prior art package relying on purely mechanical alignment techniques/test handlers have exhibited poor tolerances and such techniques are proving to be insufficient, resulting in unacceptably high retest rates for fine-pitched devices/package structures. In contrast, the socket assembly 100 of the various embodiments may be used in conjunction with feedback alignment mechanism of embodiments herein, (e.g. capacitive or fiber-based alignment), as well as vision alignment, wherein little to no lateral motion capability is required of the handler. The test handler, thus only needs to move up and down to place a DUT inside the socket of the various embodiments. In an embodiment, the embedded X & Y linear motors along with the actuating mechanisms built into the socket housing will allow the socket to fine tune/micro adjust the X & Y positions of a DUT to achieve better socket pin to device pad alignment. The socket assembly of the various embodiments further removes the need to build into the test handler complex X & Y motion actuators to perform fine adjustments of the DUT.

Figure 1D:
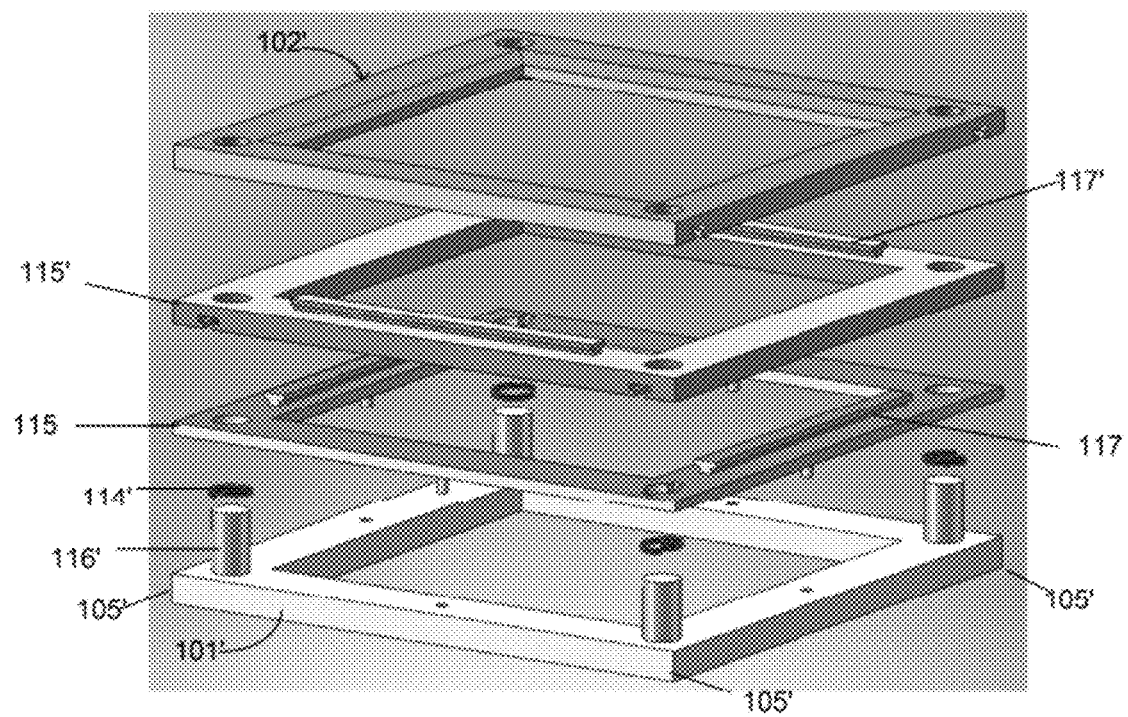

FIG. 1d illustrates another embodiment of a floating carrier 102', wherein the floating carrier 102' does not fully make contact with a main test socket housing 101' during non-testing conditions. The floating carrier 102' is attached to the main socket housing 101' via four dowel pins 116' located at each of four corners 105' of the socket housing 101'. The floating carrier 102' further comprises four holes 103' (not shown, but similar to the four floating carrier holes 103 of the socket assembly 100 of FIG. 1b, for example) at the corners 105' of the floating carrier 102', which may be sized to be slightly larger than the dowel pins 116'. The oversized holes 103' allow the carrier 102' to move freely in both X & Y directions. The carrier 102' sits on top of four springs 114' which are used to provide restoring force to return the carrier 102' to its original vertical position after socketing is complete. Rails 115, 115' comprising slots 117, 117' are disposed between the floating carrier 102' and the socket housing 101'. The rails 115, 115', the socket housing 101' and the floating carrier 102' are coupled/locked together by the slots 117, 117' wherein the rails 115, 115', the socket housing 101' and the floating carrier 102' are capable of sliding relative to one another. The interlocking rails 115, 115' allow movement of a device placed in the carrier 102' to move in X and Y directions, wherein X and Y directions can be decoupled from one another mechanically. For example, by pushing in an X, there are little to no residual torquing forces which are capable of changing the carrier movement in the Y position.

Figure 2A:
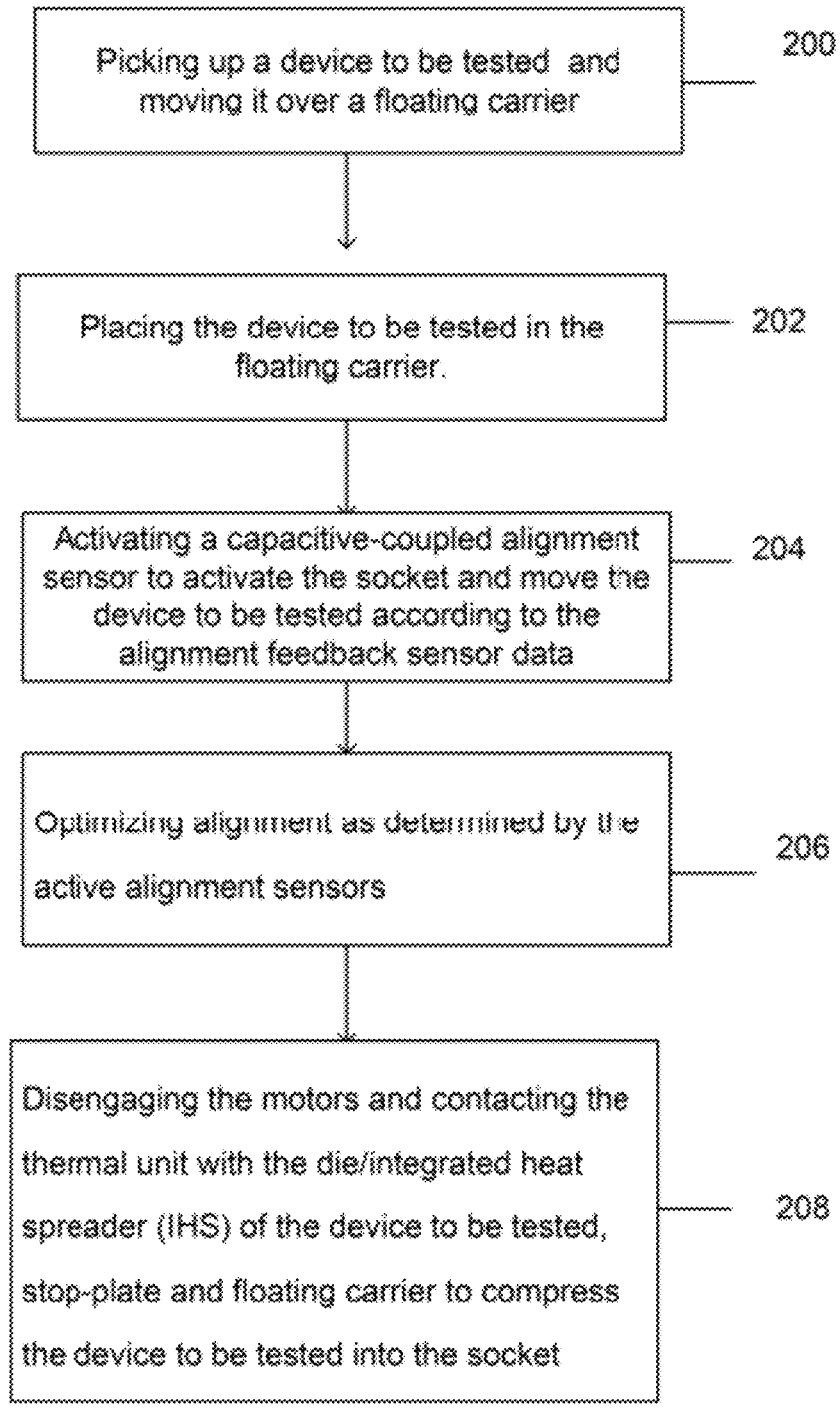
FIGS. 2a-2b represent flow charts according to embodiments of the present invention.

In an embodiment, a DUT may be placed in the floating carrier, fine tune aligned by utilizing the motor assembly embedded in the socket assembly of the embodiments, and then compressed into place in a test socket. For example (referring to FIG. 2a), in an embodiment, a test socketing sequence utilizing the socket assembly embodiments herein may comprise, at step 200, picking up a device to be tested and moving it over a floating carrier. At step 202, Placing the device to be tested in the floating carrier. At step 204, Activating a capacitive-coupled alignment sensor to activate the socket and move the device to be tested according to the alignment feedback sensor data. At step 206, Optimizing the device to be tested alignment as determined by the active alignment sensors. At step 208, disengaging the motors and contacting the thermal unit with the die/integrated heat spreader (IHS) of the device to be tested, stop-plate and floating carrier to compress the device to be tested into the socket.

Figure 2B:
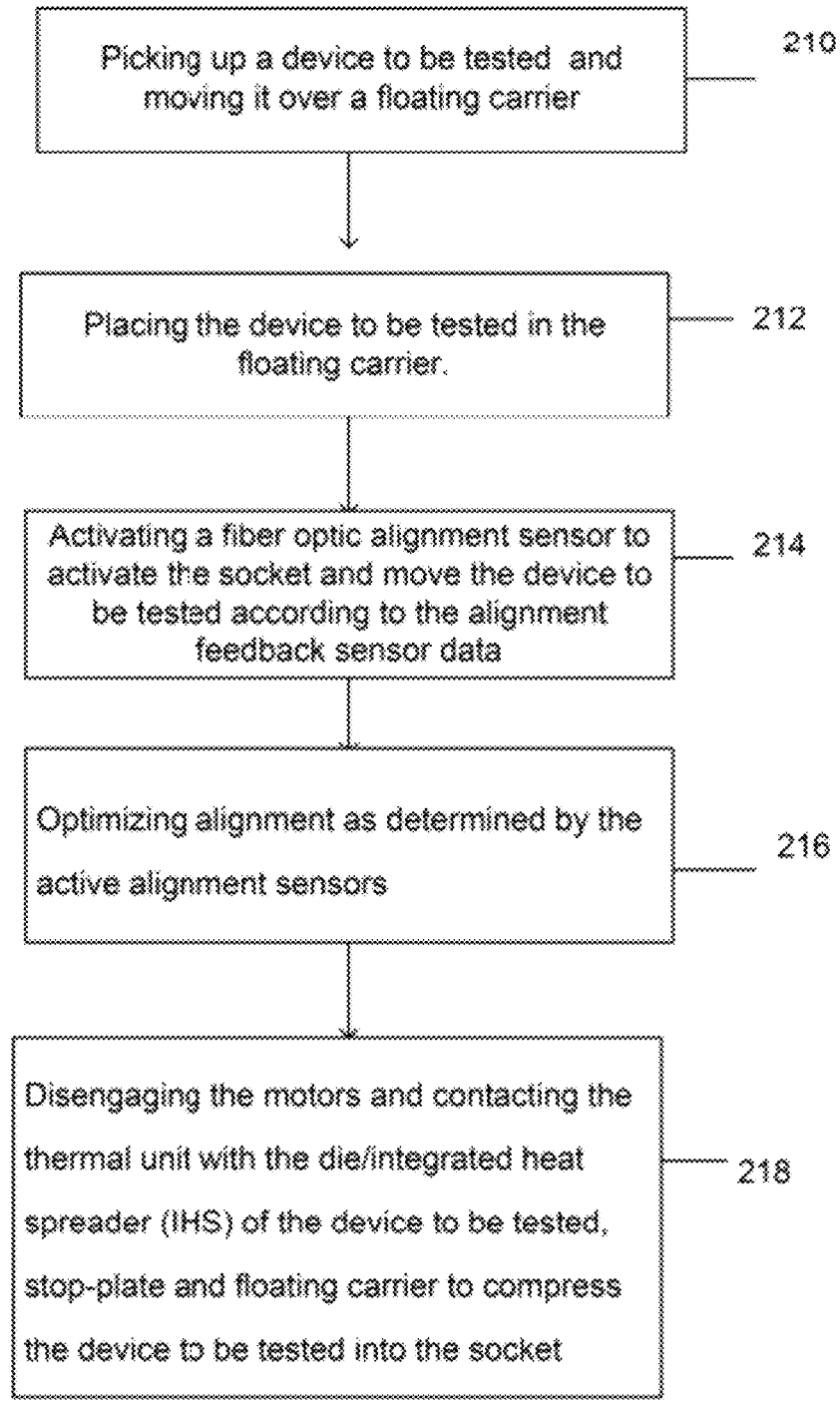

In another embodiment (FIG. 2b), a test socketing sequence utilizing the socket assembly embodiments herein may comprise, at step 210, picking up a device to be tested and moving it over a floating carrier. At step 212, Placing the device to be tested in the floating carrier. At step 214, Activating a fiber optic alignment sensor to activate the socket and move the device to be tested according to the alignment feedback sensor data. At step 216, Optimizing the device to be tested alignment as determined by the active alignment sensors. At step 218, Disengaging the motors and contacting the thermal unit with the die/integrated heat spreader (IHS) of the device to be tested, stop-plate and floating carrier to compress the device to be tested into the socket.

Figure 3A:
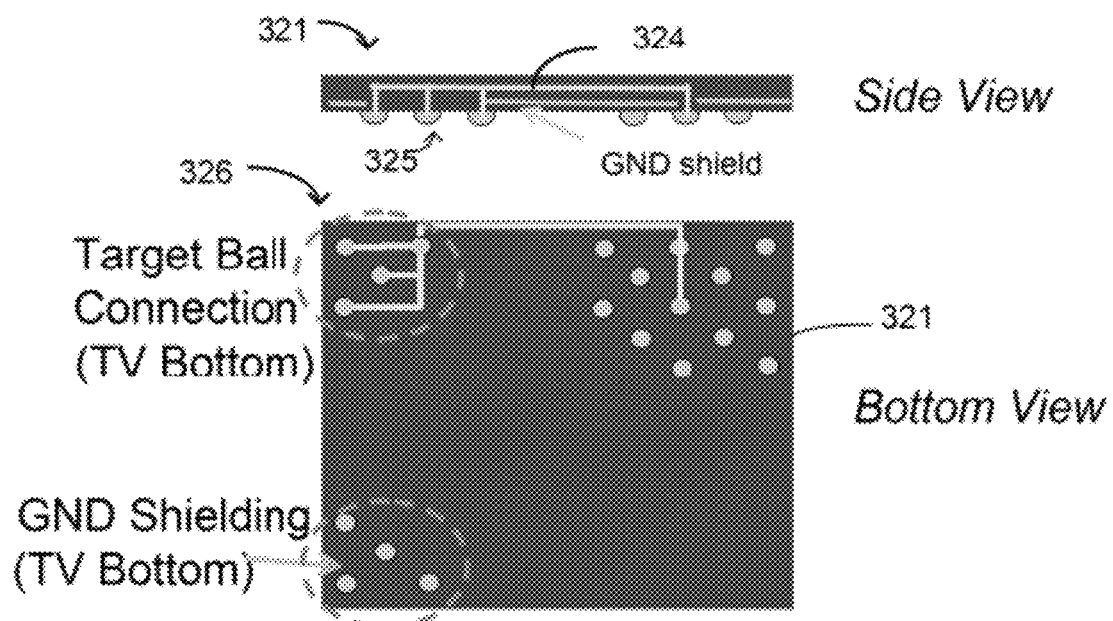
FIGS. 3a-3d represent methods and structures for testing devices according to embodiments of the present invention.
Figure 3B:
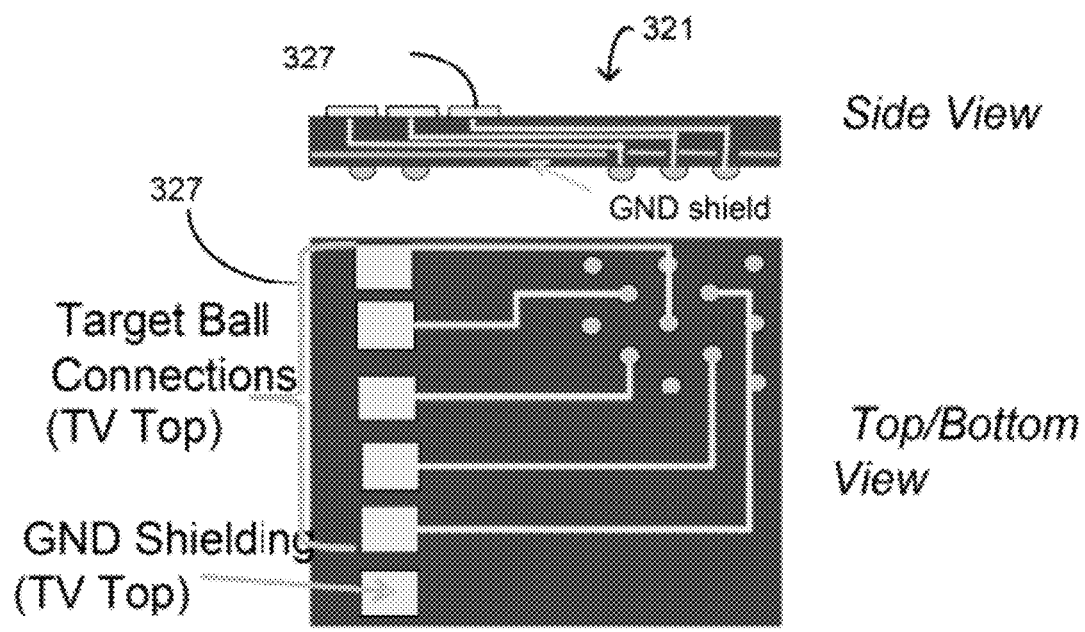
Figure 3C:
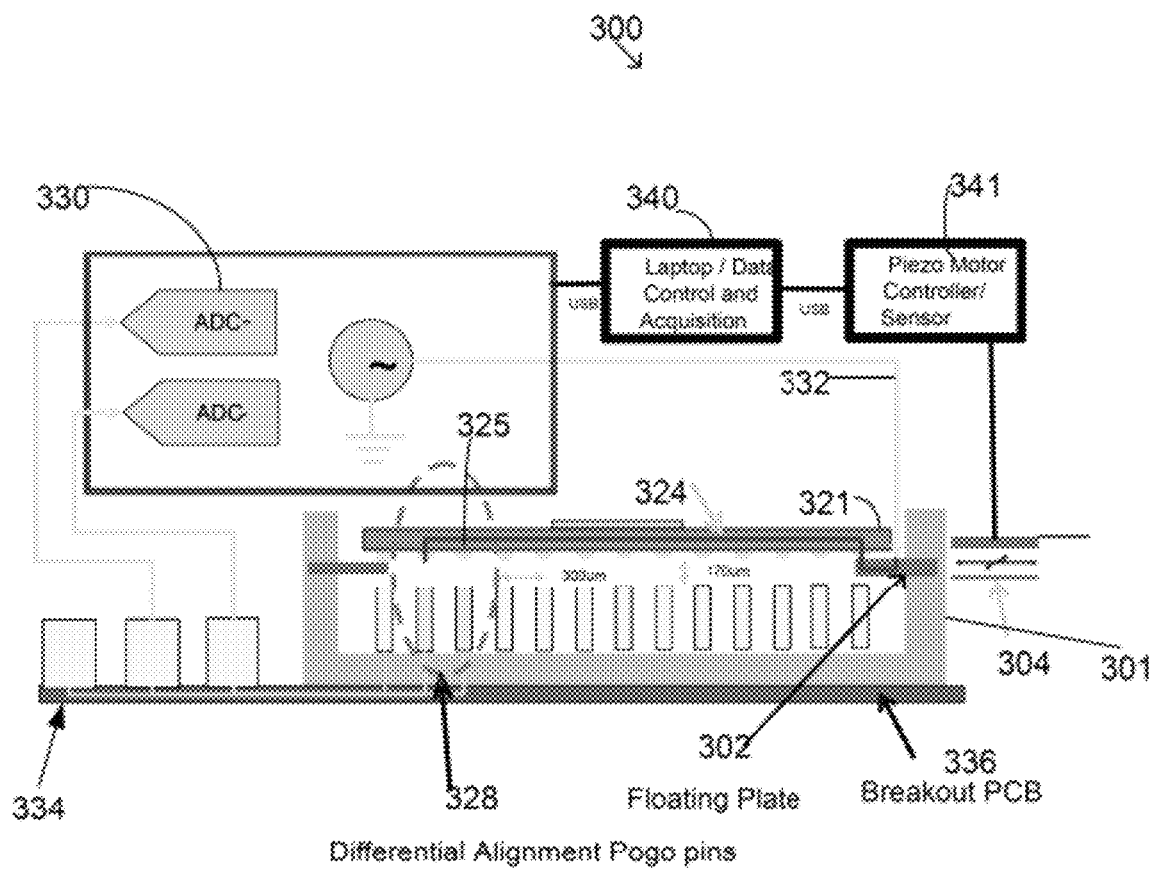

In an embodiment, an active alignment system using capacitive coupled alignment system 300 may comprise a package/device 321, having an embedded shielded alignment trace 324, wherein the shielded alignment trace 324 may be routed from two NCTF (non-critical to function) corner balls 325 to an alignment ball 326 on an opposite side of the package 321 (FIG. 3a). Referring to FIG. 3c, the NCTF contacts 325 may be energized with a square waveform 332 through a floating carrier plate 302 of socket 301, which may be similar to the socket 101 and floating carrier plate 102 of FIG. 1a, for example. In one embodiment, the modulated electric field signal 332 may be measured by a differential pair of pogo pins 328 disposed on the bottom of the socket 301 as the package/device 321 is scanned using the socket motors 304, and routed to an analog-to-digital converter circuit 330. In another embodiment, the modulated electric field signal 332 may be measured by a single pogo pin 328, (instead of the pair shown) to arrive at a single ended measurement.

Figure 3D:
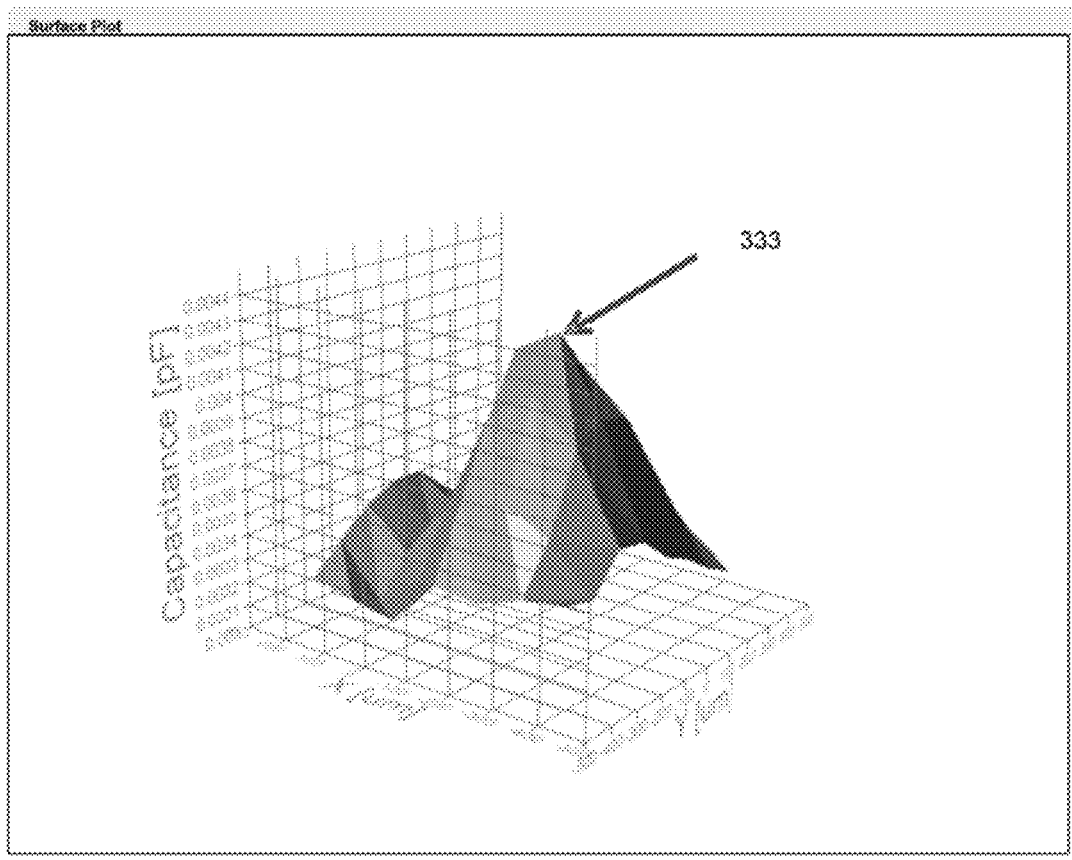

Maximum measured capacitance 333 between the alignment pogos 328 and the alignment package balls 325 indicates optimal alignment (FIG. 3d). In another embodiment, top-side LGA pads 327 or bottom-side LGA alignment pads 327 can be substituted for the NCTF balls 325 according to the particular application (FIG. 3b). The capacitive measurement system 300 may further comprise a modulator, high resolution ADC sensors and control logic 330, host PC system 340, motor controller 341 and X/Y motors 304, breakout PCB/tester board 336, and SMA connectors 334 (FIG. 3a).

Figure 4:
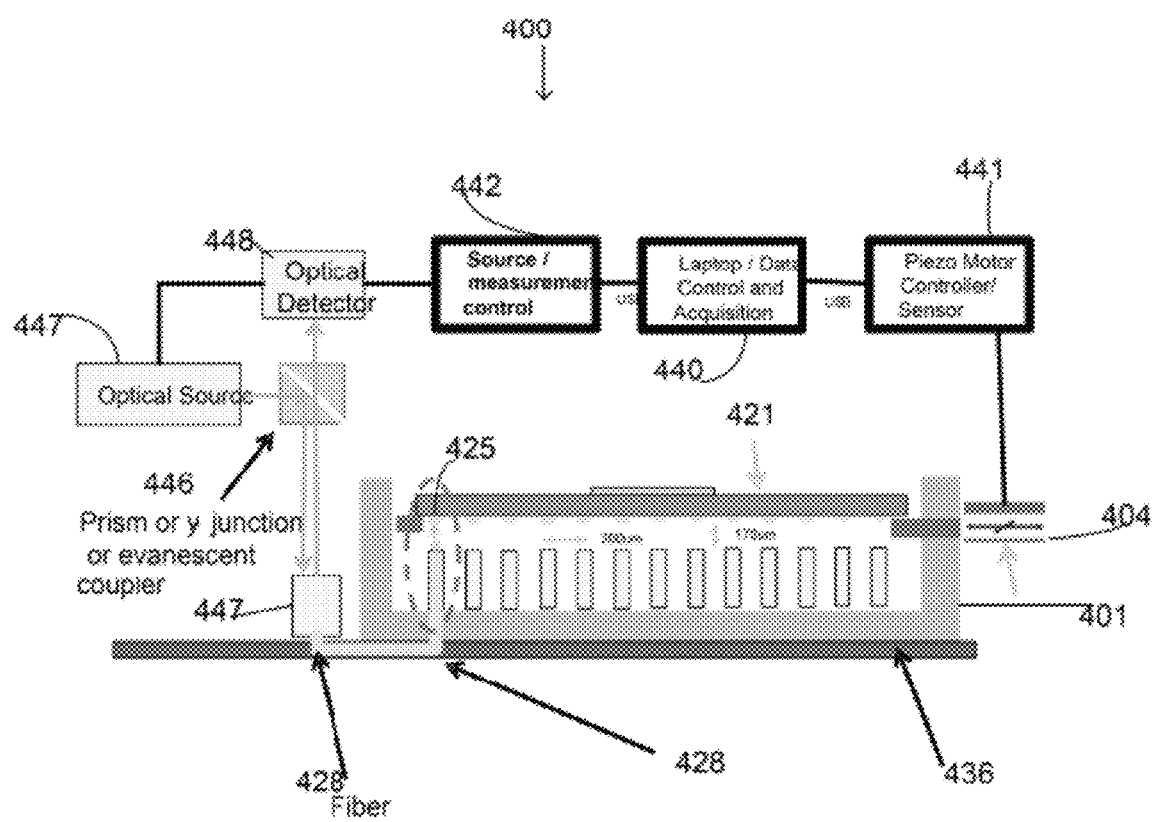
FIG. 4 represents methods and structures for testing devices according to embodiments of the present invention.

In another embodiment, active alignment can be achieved through a fiber-optic optical feedback system 400 (FIG. 4). A NCTF pin or redundant ground pogo pin may be removed in the socket 401 and may be replaced with an optical fiber probe 428 of similar pogo pin diameter. This fiber probe 428 may be routed either through a board 436 (coupled with the socket 401) vertically, or right-angle mirror-coupled from the side of the socket 401. The other end of the fiber probe 428 may enter a splitter, such as a 3 dB 50/50 splitter 446, for example, whose end-points may comprise a laser diode 447 and photodetector 448 respectively. As a DUT 421 is scanned across the fiber probe tip 428 using the socket motors 404, a maximum detected in the reflected optical power from the ball, such as an alignment package ball 425, indicates optimal alignment. The Fiber-optic sensor feedback system may further comprise a laser source 447, host PC system 440, motor controller 441, breakout PCB 436/tester board 436, and source measurement controllers 442 (FIG. 3a).

Figure 5:
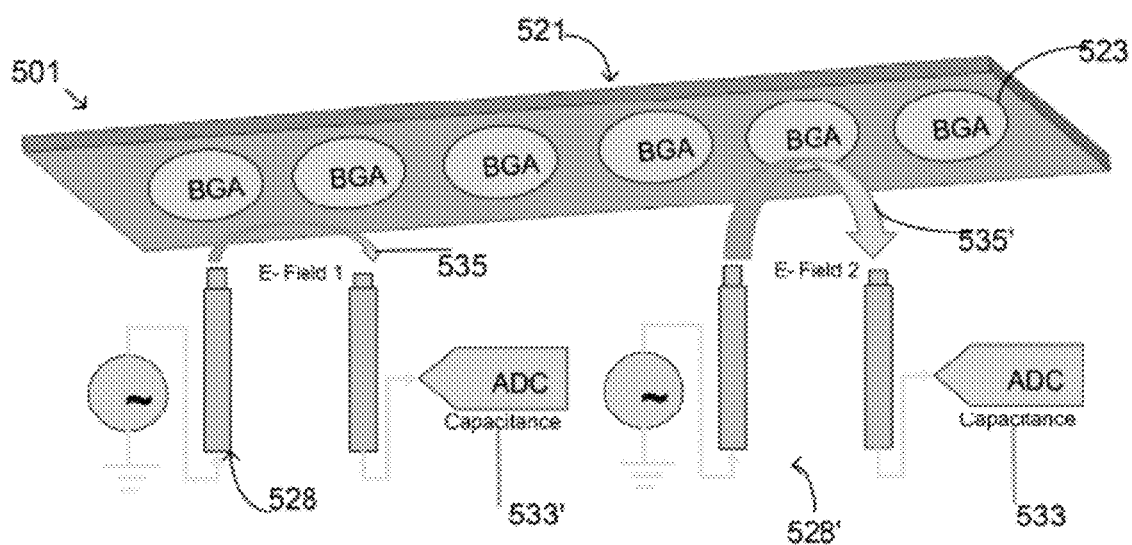
FIG. 5 represents methods and structures for testing devices according to embodiments of the present invention.

In another embodiment, active co-planarity detection can be achieved through the use of a capacitive-coupled technique, such as by utilizing a modified capacitive coupled system, similar to that of FIG. 3c, for example. For example, a transmitter/receiver pogo pin pair 528 may be disposed at greater than two of a socket housing's 501 corners (FIG. 5). Co-planarity problems may be detected by measuring the relative capacitance readings at each of the two or greater corners. In the case of two pogo pin pairs 528, 528', fringe electric fields 535, 535' may develop around each of the pogo pin pairs 528, 528' and these fields may be disrupted by the presence of the package 521 in the socket housing 501.

As the package 521 gets closer to the sense pogos 528, 528', the measured capacitance between the pogo pin pairs 528, 528' decreases as the fringe fields 535,535' are progressively disrupted. In this way, package 521 tilt may be precisely detected in the socket 501 and thus socket and package 521 damage may be prevented. In an embodiment, an adjacent pogo pin pair may be devoted at each of 3 socket corners, wherein differences in the relative capacitances may be measured to determine if the package is seated flat in the socket housing. The closer the package is to the pogo pins, the lower the measured capacitance due to fringe field crowding. The co-planarity of the device to be tested may be optimized at the minimum capacitance difference as measured between corners of the socket housing. The capacitive technique of the embodiments herein may detect if a DUT is not seated in a co-planar manner with the pogo array of the housing before a thermal chuck compresses it, thus preventing damage.

Thus, methods of micro positioning a test socket by active precision alignment and co-planarity feedback using capacitive coupled and fiber-optic sensing are enabled. The methods and structures herein enable bottom and/or top-side package contact products and/or products which require extremely accurate alignment. Benefits of the embodiments enable an active alignment feedback sensing to control the piezoelectric motors to high mechanical placement accuracy. Below about 0.3 mm pitch, however, existing camera systems are good to about +/−30 um. The capacitive-coupled feedback embodiments herein are accurate to about +/−10 um. Fiber-optic alignment embodiments herein are accurate down to about +/−5 um. Both of these alignment options are nearly an order of magnitude cheaper and more capable than the best camera systems of the prior art. The test sockets assembly of the embodiments herein enable the alignment of very fine-pitch BGA, LGA, or PGA products to a socket. This will be needed as pitch reaches 0.3 mm and below. CPU's/processors, chipsets, graphics devices, wireless devices, multi-chip/3D Packages including CPU in combination with other devices Memory (e.g., flash/DRAM/SRAM/etc.), Boards (e.g., motherboards, etc.) may utilize the systems/structures and methods of the embodiments described herein.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic device that pertains to the practice of the present invention. Thus the present invention is not limited to the structures described herein.

What is claimed is:

1. A method comprising;
placing a device in a floating carrier, wherein the floating carrier is coupled to a socket housing by pin dowels disposed in four corners of the socket housing, and wherein at least two actuating motors are disposed within the socket housing; and
micro adjusting the device by utilizing a capacitive coupled alignment system wherein a maximum measured capacitance between alignment pogos disposed in the socket housing and alignment package balls disposed within the device indicate optimal alignment of the device.

2. The method of claim 1 wherein the capacitive coupled alignment system further comprises a modulator, high resolution ADC sensor and control logic, and a host PC system.

3. The method of claim 2 wherein the device further comprises an embedded shielded trace coupled to the alignment package balls.

4. The method of claim 3 wherein the actuating motors align the device disposed in the floating carrier in an X and a Y direction before the device is compressed into the socket housing.

5. The method of claim 1 wherein the device comprises below about a 0.3 mm pitch.

6. The method of claim 4 wherein the alignment package balls are energized with a square waveform through the floating carrier.

7. The method of claim 6 wherein a modulated electric field signal from the square waveform is measured by a differential pair of pogo pins disposed within the socket housing and is routed to an analog-to-digital converter circuit.

8. The method of claim 1 wherein the capacitive coupled system detects co-planarity in the device before compression of the device into the socket housing.

9. The method of claim 8 wherein the capacitive coupled system comprises transmitter/receiver pogo pin pairs within at least two socket housing corners, wherein a relative capacitance is measured at each corners, and wherein fringe electric fields that develop around each of the pogo pin pairs are disrupted by the presence of the device, and wherein the measured capacitance difference between the pogo pin pairs decreases as the fringe fields are progressively disrupted.

10. A structure comprising:
   a socket housing assembly;
   a floating carrier disposed above the socket housing; and
   at least two piezoelectric linear motors disposed within the socket housing capable of performing X and Y positioning of a device disposed within the floating carrier, wherein the motors are capable of aligning a device disposed in the floating carrier in an X and a Y direction according to feedback from a capacitive coupled alignment system.

11. The structure of claim 10 wherein the floating carrier further comprises spring loaded pushers disposed on at least two sides of the floating carrier.

12. The structure of claim 10 wherein the socket housing comprises a pin dowel disposed through each of four holes located in the four corners of the floating carrier that couple the socket with the floating carrier.

13. The structure of claim 10 wherein the structure comprises a host PC coupled with the motors.

14. The structure of claim 10 wherein the floating carrier comprises four holes at each corner of the floating carrier, and wherein the carrier holes diameter is larger than diameter of the dowel pins.

* * * * *